United States Patent
Lim et al.

(10) Patent No.: US 10,401,397 B2
(45) Date of Patent: Sep. 3, 2019

(54) DEVICE FOR MEASURING INTEGRATED CIRCUIT CURRENT AND METHOD OF MEASURING INTEGRATED CIRCUIT CURRENT USING THE DEVICE

(71) Applicant: Samsung Electronics Co., Ltd., Suwon-si, Gyeonggi-do (KR)

(72) Inventors: Sang-Ho Lim, Suwon-si (KR); Sang-Ho Lee, Seoul (KR); Chea-Ok Ko, Yongin-si (KR); Jong-Wan Shim, Hwaseong-si (KR); Jeong-Nam Cheon, Seoul (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 1320 days.

(21) Appl. No.: 14/174,375

(22) Filed: Feb. 6, 2014

(65) Prior Publication Data
US 2014/0222360 A1    Aug. 7, 2014

(30) Foreign Application Priority Data
Feb. 7, 2013    (KR) ......................... 10-2013-0013673

(51) Int. Cl.
*G01R 19/00*    (2006.01)
*G06F 17/14*    (2006.01)

(52) U.S. Cl.
CPC ............................... *G01R 19/0092* (2013.01)

(58) Field of Classification Search
CPC ..... G06F 17/5036; G06F 17/14; G01R 19/00; G01R 19/0092; H05K 3/0005; H05K 1/0216

USPC ............................................... 702/65; 703/14
See application file for complete search history.

(56) References Cited

U.S. PATENT DOCUMENTS

| | | | |
|---|---|---|---|
| 8,412,497 B1* | 4/2013 | Alexander | G06F 17/5036 703/14 |
| 2009/0058558 A1* | 3/2009 | Okano | H05K 1/0216 333/181 |
| 2009/0213558 A1* | 8/2009 | Osaka | H05K 3/0005 361/748 |
| 2009/0234630 A1 | 9/2009 | Clement | |

(Continued)

FOREIGN PATENT DOCUMENTS

| | | |
|---|---|---|
| JP | 2000-321321 A | 11/2000 |
| JP | 2002-197137 A | 7/2002 |
| JP | 2004-085477 A | 3/2004 |

(Continued)

OTHER PUBLICATIONS

Archambeault "Effective Power/Ground Plane Decoupling for PCB" pp. 1-104; Oct. 2007.*

(Continued)

*Primary Examiner* — Regis J Betsch
*Assistant Examiner* — Kaleria Knox
(74) *Attorney, Agent, or Firm* — Jefferson IP Law, LLP

(57) ABSTRACT

A method of extracting an Integrated Circuit (IC) current is provided. The method includes generating a transfer function value by using a voltage measured in a node nearest an input terminal of the IC, substituting the generated transfer function value for a reverse fast Fourier transform function, so as to extract the IC voltage, and extracting the IC current from the extracted IC voltage through a simulation in a time domain.

20 Claims, 14 Drawing Sheets

(56) References Cited

U.S. PATENT DOCUMENTS

2012/0136598 A1* 5/2012 Dmitriev-Zdorov ............... G06F 17/5063 702/65

FOREIGN PATENT DOCUMENTS

JP 2009-503668 A 1/2009
KR 10-1995-0009991 A 4/1995

OTHER PUBLICATIONS

Popovich "High Performance Power Distribution Networks with On-Chip Decoupling Capacitors for Nanoscale Integrated Circuits" (Year: 2007).*
http://www.apache-da.com/products/sentinel/chip-power-model.
Jingook Kim et al., Closed-Form Expressions for the Maximum Transient Noise Voltage Caused by an IC Switching Current on a Power Distribution Network, IEEE Transactions on Electromagnetic Compatibility, Oct. 2012.
Fan Zhou et al., Measuring IC Switching Current Waveforms Using a GMI Probe for Power Integrity Studies, 2010 Asia-Pacific International Symposium on Electromagnetic Compatibility, Apr. 12-16, 2010, Beijing, China.
Liang Li et al., Measurement of multiple switching current components through a bulk decoupling capacitor using a lab-made low-cost current probe, Aug. 14, 2011, EMC Laboratory, Missouri University of Science and Technology, 4000 Enterprise Dr., Rolla, MO, 65401, USA Sony Corporation Gotenyama Tec. May 1, 2012 Kitashinagawa Shinagawa-ku, Tokyo, 141-0001, Japan.
Changhyun Cho et al., Design and Implementation of On-chip Embedded Current Probe Using Magnetic Field Coupling in Chip to Chip Wireless Power Transfer System, May 10, 2012, Terahertz Interconnection and Package Lab., Department of Electrical Engineering, KAIST 373-1 Guseong-dong, Yuseong-gu, Daejeon 305-701, South Korea, E-mail: mydearcho@kaist.ac.kr.
Ultra Low impedance measurements using 2-port measurements, Agilent Technologies, Feb. 15, 2007.
Larry D Smith et al., On-Die Capacitance Measurements in the Frequency and Time Domains, DesignCon, Jan. 2011.
Korean Decision of Grant dated Jul. 10, 2019, issued in Korean Patent Application No. 10-2013-0013673.

* cited by examiner

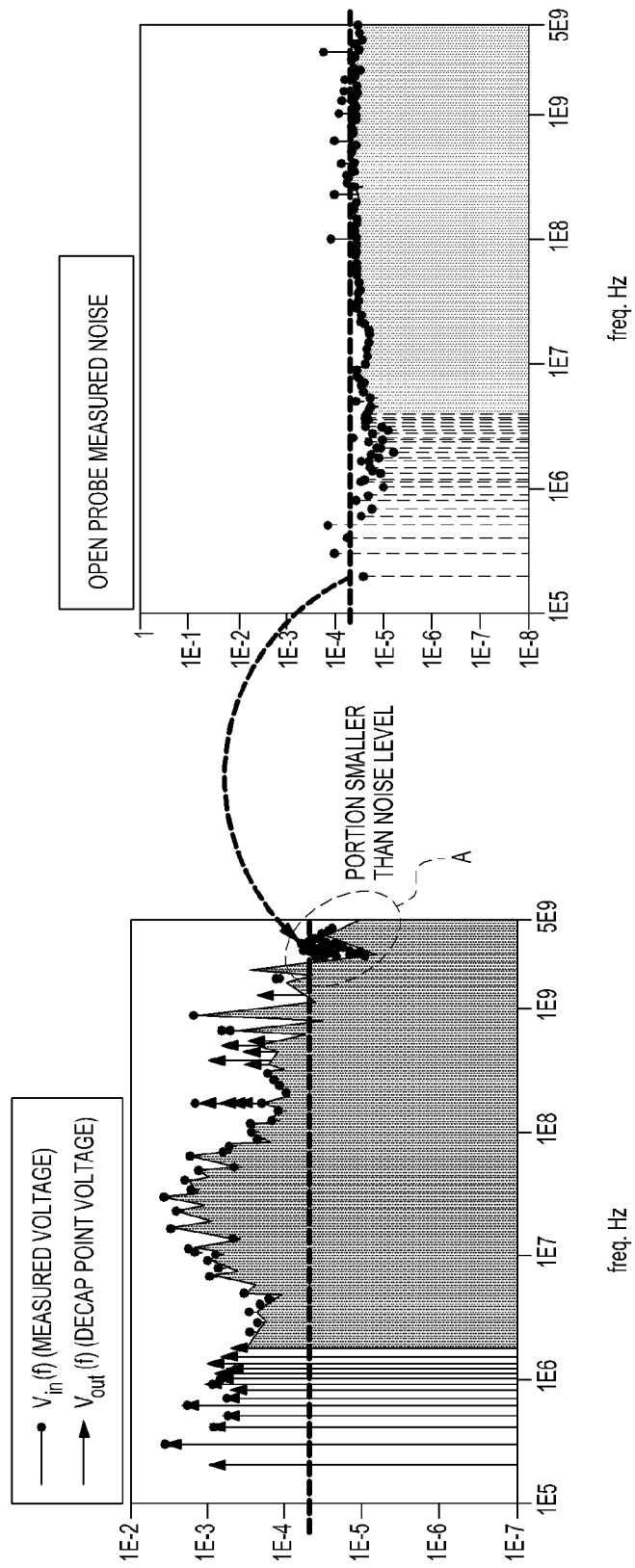

DEVICE FOR MEASURING INTEGRATED CIRCUIT CURRENT AND METHOD OF MEASURING INTEGRATED CIRCUIT CURRENT USING THE DEVICE

CROSS-REFERENCE TO RELATED APPLICATION(S)

This application claims the benefit under 35 U.S.C. § 119(a) of a Korean Patent Application filed on Feb. 7, 2013 in the Korean Intellectual Property Office and assigned Serial number 10-2013-0013673, the entire content of which is hereby incorporated by reference.

TECHNICAL FIELD

The present disclosure relates to a device and a method for measuring integrated circuit current. More particularly, the present disclosure relates to a device and a method for measuring integrated circuit current, which are used to design an efficient Power Distribution Network (PDN).

BACKGROUND

Recently, Integrated Circuits (ICs) mounted on a Printed Circuit Board (PCB) have been developed to operate with a high power consumption at a low operating voltage and a high operating frequency. Thus, the recently developed ICs consume a large amount of current.

An increase of consumed current in the ICs means an occurrence of voltage noise Vnoise caused by inductance of the PDN. The voltage noise Vnoise may be indicated by Equation (1) below.

$$V_{noise} = L\frac{dI}{dt} \quad \text{Equation (1)}$$

On the other hand, the voltage noise $V_{noise}$ occurring by Equation (1) causes a stable operation error in a corresponding IC, and also propagates through the PDN so as to have a bad effect on another IC adjacent thereto. Further, the voltage noise $V_{noise}$ radiates outside of a device and causes an Electromagnetic Interference (EMI) problem. Therefore, a design of the PDN capable of restraining the voltage noise $V_{noise}$ is very important.

In order to design the PDN considering the voltage noise $V_{noise}$, it is essential to obtain information on IC current. The reason is because the IC current $$\frac{dI}{dt}$$

functions are a source of the voltage noise $V_{noise}$.

Since a design of the PDN without a consideration of an accurate IC current causes significant use of an unnecessary de-coupling capacitor, a possibility of an over-design is significant. Further, an inaccurate value is deduced when a Power Integrity (PI) simulation, a Signal Integrity (SI) simulation, and an EMI simulation are performed in order to evaluate the performance of the system. Thus, there are many preceding researches and efforts for obtaining information on an accurate IC current, and currently researches have actively proceeded.

As an existing method of obtaining model information on the IC current, there are (1) a method of using information on Simulation Program with "http://en.wikipedia.org/wiki/SPICE, (2) a method of measuring current at a position of designing a bulk on a board and a de-coupling capacitor, and (3) a method of inserting a current probe in the IC.

(1) The method of using the SPICE model information of the IC is a method of obtaining the information on the IC current by using the SPICE model information of the IC. That is, if the SPICE model information of the IC is secured, the IC current information may be obtained by using a Chip Power Model (CPM) of a sentinel simulation tool. Accordingly, the IC current information may be extracted in a frequency range from a DC band to a several GHz band, and a system simulation in which all the IC, a package including the IC and a PCB including the IC and the package are considered, may be performed by using the IC current information. However, from a standpoint of a PCB designer, it is substantially difficult to obtain the SPICE information of the IC because of a problem such as an outflow of technology and the like. Although the designer obtains the IC current information with a help of an IC vendor, an IC current value may be obtained only under a very restricted environment. Accordingly, a value measured on the board may be substituted for the IC current value in order to obtain the IC current information in consideration of various operation circumstances and environments.

(2) The method of measuring the IC current at a position of designing the bulk and de-coupling capacitor is a method of obtaining the IC current by using a magnetic loop probe. That is, the current value measured at a position of the de-coupling capacitor and the bulk capacitor by using the magnetic loop probe is regarded as the IC current.

On the other hand, the IC current includes various current components, and each current component includes different frequency components. Accordingly, the IC current is established by a combination of the different frequency values.

FIG. 1 is a graph illustrating a frequency distribution of an IC current according to the related art.

Referring to FIG. 1, a capacitor supplying an IC with electric current depending on a frequency range is determined by each Self Resonance Frequency (SRF). That is, the IC current corresponding to a frequency range ($i_{ODC}$ region) of more than several hundred MHz is an electric current ($i_{ODC}$) supplied by On-Die Capacitance (ODC) present in the IC, and the IC current corresponding to a frequency range ($i_{decap}$ region) of several MHz to several hundred MHz is an electric current ($i_{decap}$) supplied by the de-coupling capacitor. Also, the IC current corresponding to a frequency range ($i_{bulk}$ region) corresponding to a frequency range equal to or less than several MHz is an electric current ($i_{bulk}$) supplied by the bulk capacitor and a Voltage Regulation Module (VRM). Accordingly, the electric current measured on the de-coupling capacitor and the bulk capacitor corresponds to an electric current in a corresponding frequency range of the IC. However, there is a disadvantage in that the IC current component supplied by the ODC cannot be identified by this method. Further, if the PDN is constituted of a trace with a narrow width and the number of the de-coupling capacitor and the bulk capacitor is small, the measurement of the corresponding current is possible. However, in a situation in that the PDN is constituted of a plane and plural capacitors with the same capacitance are massed, the electric current must be simultaneously measured on the capacitors with the same capacitance by a plurality of current probes. Therefore, there is a disadvantage in that it is difficult to apply this method to this case.

On the other hand, (3) the method of inserting the current probe in the IC is a method of measuring the IC current by using the magnetic coupling scheme in which the current probe is inserted in the IC. If this method is used, the current component supplied by the ODC may be extracted. In comparison with the simplified current measurement model of the previous methods (1) and (2), this method has an advantage of providing very precise information. However, since the current probe is always inserted in the IC to be measured in order to use the method (3), there is a disadvantage in view of efficiency of a space and a cost.

Accordingly, a method of extracting an IC current, which is capable of obtaining IC current information in various operating circumstances and environments and extracting a component of the IC current supplied by On-Die Capacitance (ODC) is desired.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method of extracting an IC current, which is capable of obtaining IC current information in various operating circumstances and environments and extracting a component of the IC current supplied by On-Die Capacitance (ODC).

Another aspect of the present disclosure is to provide a device for extracting an IC current, which is capable of obtaining IC current information in various operating circumstances and environments and extracting a component of the IC current supplied by On-Die Capacitance (ODC).

In accordance with an aspect of the present disclosure, a method of extracting an Integrated Circuit (IC) current using an IC current extracting device, the IC current extracting device electrically connected to a substrate provided with an IC is provided. The method includes generating a transfer function value by using a measurement voltage measured in a node nearest an input terminal of the IC, substituting the generated transfer function value for a reverse fast Fourier transform function so as to extract the IC voltage, and extracting the IC current by simulating the extracted IC voltage in a time domain.

In accordance with another aspect of the present disclosure, a device for extracting an Integrated Circuit (IC) current, the device provided on a substrate, is provided. The device includes a transfer function generating unit configured to generate a transfer function value using a voltage of a node nearest an input terminal of the IC, an IC voltage extracting unit configured to convert the generated transfer function value into a reverse fast Fourier transform to extract the IC voltage, and an IC current extracting unit configured to extract the IC current by simulating the extracted IC voltage in a time domain.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 9A, 9B, 9C, and 9D are graphs illustrating a reason of excessively calculating an IC voltage in the case where a probe noise is not considered according to an embodiment of the present disclosure;

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, various embodiments of the present disclosure will be described in detail with reference to the accompanying drawings to be easily implemented by those skilled in the art to which the present disclosure pertains.

Obtaining accurate information on an Integrated Circuit (IC) current is an important factor to design a Power Distribution Network (PDN). Thus, in an embodiment of the present disclosure, when a PDN designer cannot secure detailed IC data, a method of measuring the accurate IC current using a voltage measured on a board (a method of extracting or calculating an IC current) is proposed. Here, the measured voltage (or a waveform of the measured voltage) is measured at a de-coupling capacitor nearest an IC after capacitors on the board are removed. Further, in an embodiment of the present disclosure, a new transfer function to which the measured voltage and the probe noise effect are applied is proposed, and a method of calculating the accurate IC current by using the proposed new transfer function is proposed.

Hereinafter, an embodiment of the present disclosure will be described in detail with reference to the accompanying drawings.

Figure 1:
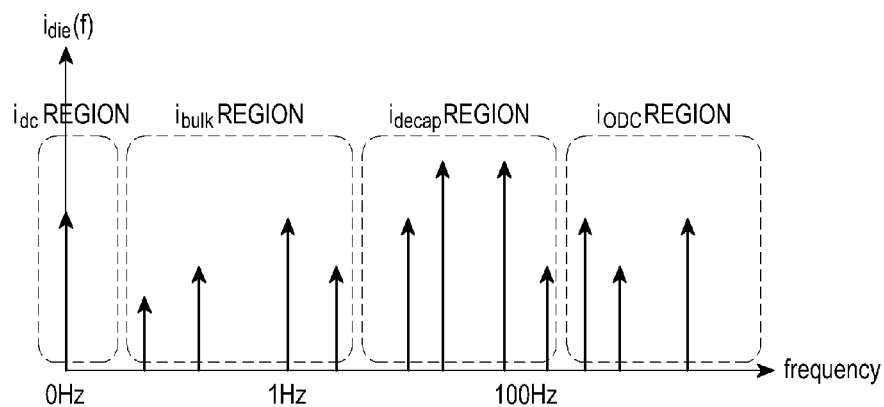
FIG. 1 is a graph illustrating a frequency distribution of an Integrated Circuit (IC) current according to the related art.
Figure 2:
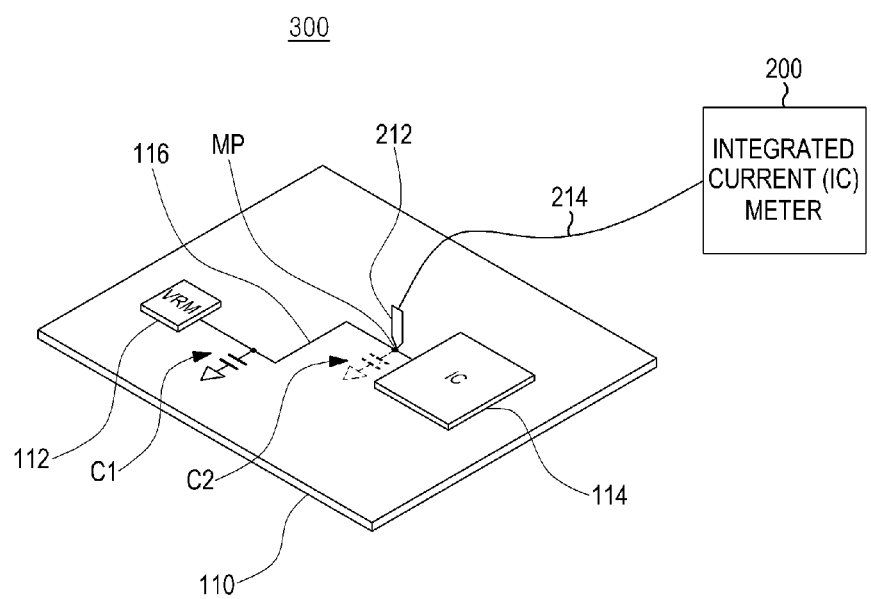
FIG. 2 is a view illustrating a configuration of a system according to an embodiment of the present disclosure.

FIG. 2 is a view illustrating a configuration of a system according to an embodiment of the present disclosure.

Referring to FIG. 2, in order to obtain the accurate IC current information, a system 300 according to an embodiment of the present disclosure includes a board 110 which is provided with a corresponding IC of which a designer wants to obtain an IC current, and an IC current meter 200 for measuring a voltage at a measurement point (or node) on the board in order to obtain the IC current of the IC.

The board 110 is provided with a voltage regulation module (VRM) 112 for providing the IC with a constant voltage, an IC 114 for receiving an input of a voltage from the VRM 112 so as to operate, and a power trace 116 for electrically connecting the VRM 112 with the IC 114.

The power trace 116 has a structure in that a plurality of capacitors such as a bulk capacitor for filtering a voltage noise C1 and a de-coupling capacitor C2 are parallel connected.

The IC current meter 200 receives an input of a voltage $V_{decap}$ which is measured at a certain measurement point on the board 110 so as to calculate (extract or calculate) the accurate IC current, in which the measured V voltage $V_{decap}$ is a voltage $V_{decap}$ which is measured at a measurement point nearest a voltage input terminal of the IC 114, and the measurement point is a measurement point of the de-coupling capacitor C2 nearest the voltage input terminal of the IC. At this time, it is noted that the V voltage $V_{decap}$ which is measured at the measurement point is a voltage which is measured in the state that the de-coupling capacitor C2 is removed. This will be described in detail below.

The IC current meter 200 receives an input of the measured voltage $V_{decap}$ through a probe head 212 mounted at a Measurement Point (MP) and a probe cable 214, so as to extract the accurate IC current value.

Figure 3:
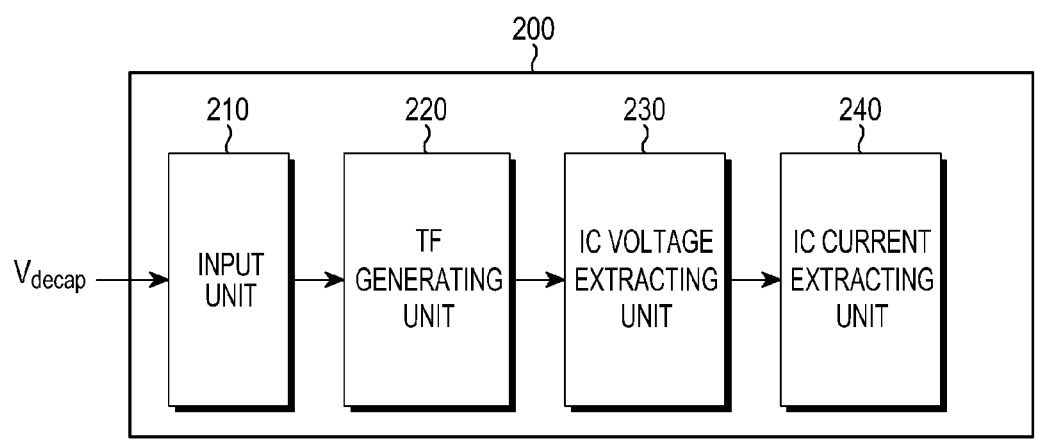
FIG. 3 is a block diagram schematically illustrating an internal structure of an IC current meter shown in FIG. 2 according to an embodiment of the present disclosure.

FIG. 3 is a block diagram schematically illustrating an internal structure of an IC current meter shown in FIG. 2 according to an embodiment of the present disclosure.

Referring to FIG. 3, the IC current meter 200 includes an input unit 210, a transfer function generating unit 220, an IC voltage extraction unit 230 and an IC current extraction unit 240.

The input unit 210 receives an input of a voltage $V_{decap}$ which is measured at a point of the de-coupling capacitor C2 nearest an input terminal of the IC 114 among the de-coupling capacitors which are removed from the board 110, and includes the probe having the probe head 212 and the probe cable 214 shown in FIG. 2.

The transfer function generating unit 220 receives the measured voltage $V_{decap}$ through the input unit 210, and generates the transfer function by using the voltage $V_{decap}$. The transfer generating unit 220 generates a new transfer function, V New-TF, to which a probe noise level is applied in order to compensate for the probe noise generated at the measurement point in the measuring process. This will be described in detail below.

The IC voltage extraction unit 230 receives a transfer function through the transfer function unit 220 and extracts the IC voltage by using the transfer function, and extracts the IC voltage by substituting the transfer function for a reverse fast Fourier transform function so as to extract the IC voltage.

The IC current extraction unit 240 receives the IC voltage extracted by the IC voltage extraction unit 230, and obtains the IC current through a simulation at a time domain.

Hereinafter, a method of extracting the IC current by using the IC current meter shown in FIG. 2 will be described in detail.

Figure 4:
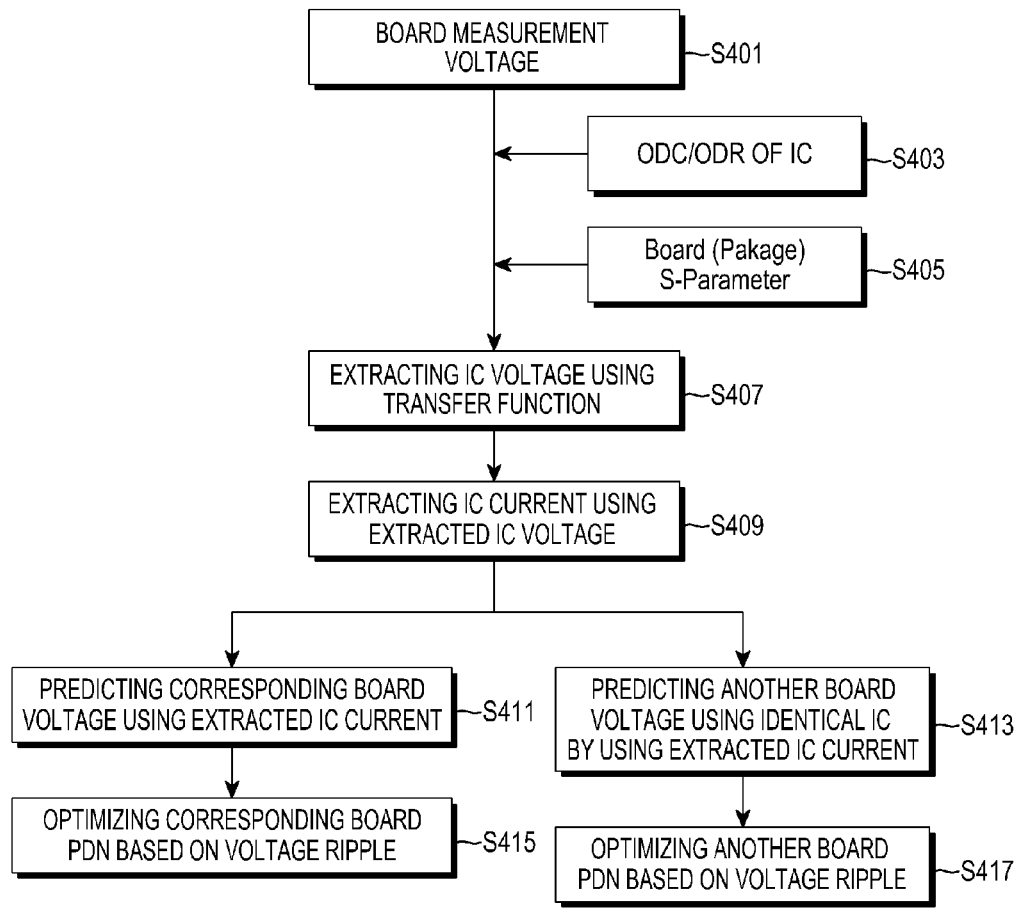
FIG. 4 is a flowchart illustrating a process of extracting an IC current using an IC current meter shown in FIG. 2 according to an embodiment of the present disclosure.

FIG. 4 is a flowchart illustrating a process of extracting an IC current using an IC current meter shown in FIG. 2 according to an embodiment of the present disclosure.

Referring to FIG. 4, in operation S401, after the capacitors on the board are removed, a process of measuring a voltage (a measured voltage on a board) at a position (or node) of the de-coupling capacitor nearest the IC is performed.

In operation S403, On-Die Capacitance/On-Die Resistance of the IC is measured. In operation S403, a two-port shunt-thru process is used to measure low impedance, and the low impedance may be measured by a network analyzer. The process of measuring the ODC/ODR of the IC is described in below documents [1] and [2]. Accordingly, the detailed description of the process will be omitted.

[1] L. D. Smith, S. Sun, M. Sarmiento, Z. Li and K. Chandrasekar, "On-Die Capacitance Measurements in the Frequency and Time Domains," Presented at the DesignCon 2011, Santa Clara, Calif.

[2] Application note, "Evaluating DC-DC Converters and PDN with the E5061B LF-RF Network Analyzer," Agilent Technologies, Inc., September 2012.

In operation S405, a process of extracting an S-parameter using a board and package CAD data obtained by using a commercially available tool is performed.

In operation S407, a transfer function is generated by using a board measuring voltage, the ODC/ODR of the IC and the S-parameter which are obtained respectively in operations S401, S403 and S405, and a process of extracting the IC voltage by using the generated transfer function is performed.

In operation S409, a process of extracting the accurate IC current through a simulation of a time domain by using the extracted IC voltage is performed.

In operation S411, the voltage of the corresponding board is extracted (predicted) by using the extracted IC current, and in operation S415, a design of the PDN of the corresponding board is optimized. In operation S413, the voltage of another board is extracted (predicted) by using the extracted IC current similarly to operation S413, and in operation S417, a design of the PDN of the board is optimized based on the voltage ripple.

Hereinafter, processes S401, S407 and S409 among operations of FIG. 4 will be described.

Figure 5:
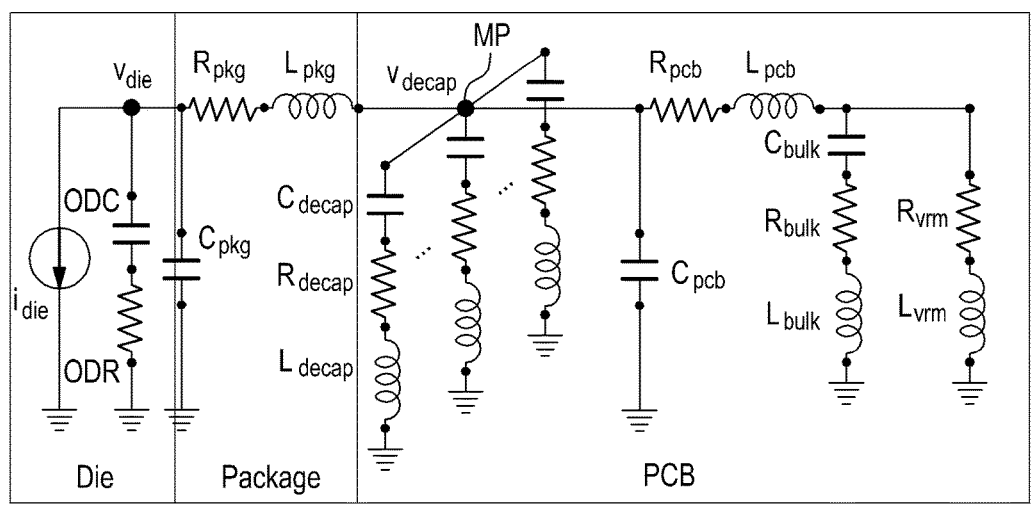
FIG. 5 is a circuit diagram illustrating an equivalent circuit of a Power Distribution Network (PDN) model applied to the system shown in FIG. 1 according to an embodiment of the present disclosure.

FIG. 5 is a circuit diagram illustrating an equivalent circuit of a PDN model applied to the system shown in FIG. 2 according to an embodiment of the present disclosure.

Referring to FIG. 5, the S-parameter of the board and the package may be obtained, and manual parts of an ODC, an ODR, an Rvrm and an Lvram may be determined by the shunt-thru method of operation S403. Accordingly, a single unknown parameter of FIG. 5 is an IC current extracted by the proposed method of the present disclosure.

Measurement of the voltage on the board in operation S401 of FIG. 4

When the voltage of the board is measured, two conditions are present. First, the voltage measurement should to be performed when the IC is in the worst operation state in order to obtain the worst IC current. Second, the measurement is performed at a point of a de-coupling capacitor nearest the IC after the capacitor is removed. As a distance between a measurement point (MP of FIGS. 2 and 5) and the IC is gradually shorter, the inductance of the board becomes low. By removing the de-coupling capacitor from the measurement point (MP of FIGS. 2 and 5), a voltage waveform similar to the IC voltage waveform may be obtained.

Figure 6A:
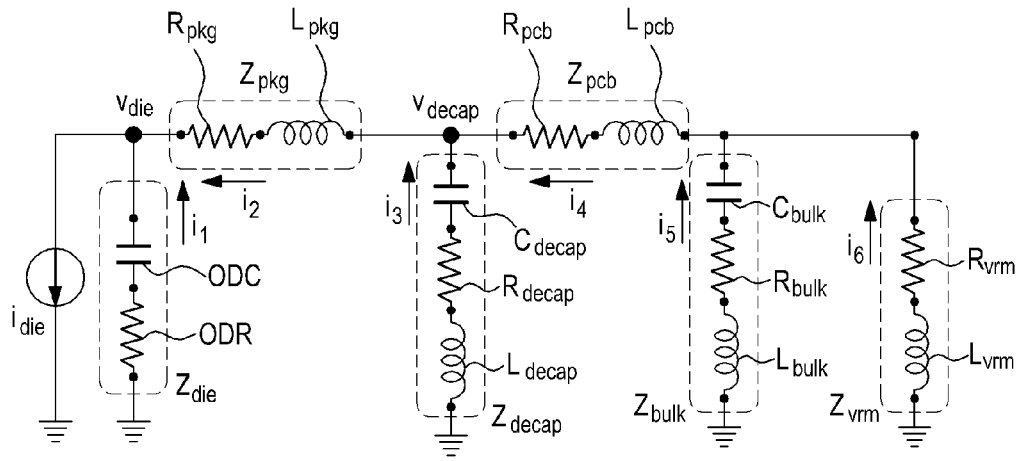
FIGS. 6A and 6B is circuit diagrams illustrating the equivalent circuit of the PDN model shown in FIG. 5, in which negligible parameters, i.e., Cpkg and Cpcb are removed and electric current flow is shown according to a presence or an absence of a de-coupling capacitor according to an embodiment of the present disclosure.
Figure 6B:
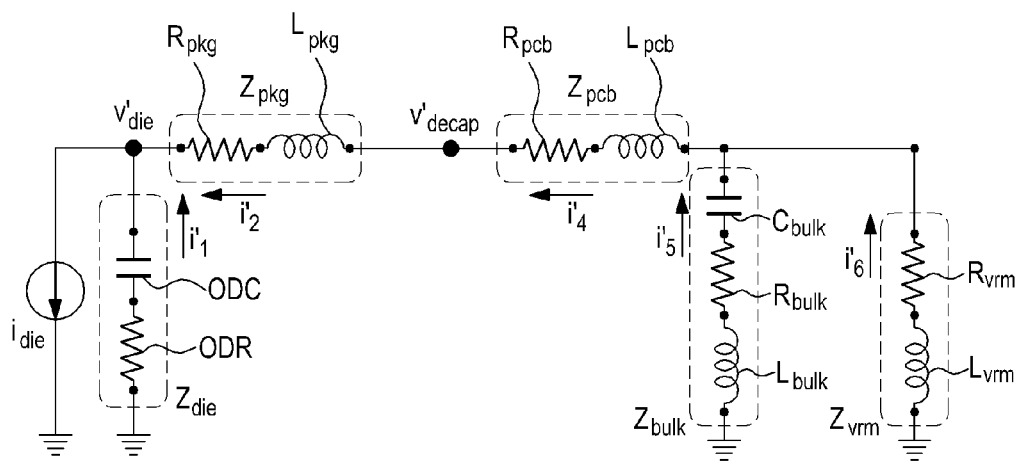

FIGS. 6A and 6B are circuit diagrams illustrating the equivalent circuit of the PDN model shown in FIG. 5, in which negligible parameters, i.e., Cpkg and Cpcb are removed and electric current flow is shown according to a presence or an absence of a de-coupling capacitor according to an embodiment of the present disclosure.

Referring to FIG. 6A, a circuit diagram illustrating an equivalent circuit in the case that the de-coupling capacitor is present, and FIG. 6B a circuit diagram illustrating an equivalent circuit in the case that the de-coupling capacitor is removed.

In the case that the de-coupling capacitor is present (in the case of FIG. 6A), electric current $i_1$ of Zdie and electric current $i_2$ of Zpkg may be expressed by Equation (2) below.

$$i_1 = \frac{Z_{pkg} + \{Z_{decap} \| [Z_{pcb} + (Z_{bulk} \| Z_{vrm})]\}}{Z_{die} + Z_{pkg} + \{Z_{decap} \| [Z_{pcb} + (Z_{bulk} \| Z_{vrm})]\}} i_{die} \quad \text{Equation (2)}$$

$$i_2 = \frac{Z_{die}}{Z_{die} + Z_{pkg} + \{Z_{decap} \| [Z_{pcb} + (Z_{bulk} \| Z_{vrm})]\}} i_{die}$$

In the case that the de-coupling capacitor is removed (in the case of FIG. 6B), electric current $i'_1$ of Zdie and electric current $i'_2$ may be expressed by Equation (3) below.

$$i'_1 = \frac{Z_{pkg} + Z_{pcb} + (Z_{bulk} \| Z_{vrm})}{Z_{die} + Z_{pkg} + Z_{pcb} + (Z_{bulk} \| Z_{vrm})} i_{die} \quad \text{Equation (3)}$$

$$i'_2 = \frac{Z_{die}}{Z_{die} + Z_{pkg} + Z_{pcb} + (Z_{bulk} \| Z_{vrm})} i_{die}$$

When the electric current of the Zpkg causing a difference of electric voltage between a die point and a point of the de-coupling capacitor is carefully examined, numerators of $i_2$ and $i'_2$ are identical, but a denominator of $i'_2$ is larger than that of $i_2$. Therefore, the electric current of Zpkg is reduced when the capacitor is removed. It may be known that the voltage waveform similar to the IC voltage waveform is obtained through Equations 2 and 3.

Nevertheless, a small voltage difference still remains due to the package manual parts Rpkg, Cpkg and Lpkg, and this small voltage difference may be compensated by the transfer function proposed by the present disclosure. This will be described in detail below.

Extraction of IC voltage and IC current in operations S407 and S409 of FIG. 4.

Figure 7:
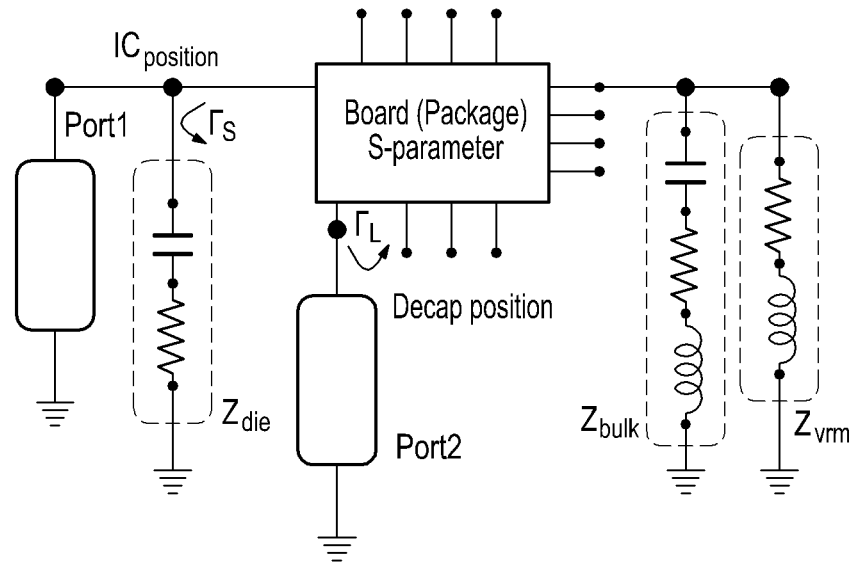
FIG. 7 is a view illustrating a transfer function based on an S-parameter according to an embodiment of the present disclosure.

FIG. 7 is a view illustrating a transfer function based on an S-parameter according to an embodiment of the present disclosure.

Referring to FIG. 7, in the case of reflection coefficients $\Gamma_S$, $\Gamma_L$ of a source and a load, an S-parameter input-to-output transfer function (STF) may be expressed by Equation (4) below.

$$STF = \frac{S_{21}}{2} \cdot \frac{(1-\Gamma_S)\cdot(1+\Gamma_L)}{(S_{11}\Gamma_S - 1)\cdot(S_{22}\Gamma_L - 1) - S_{12}S_{21}\Gamma_S\Gamma_L} \quad \text{Equation (4)}$$

Figure 8:
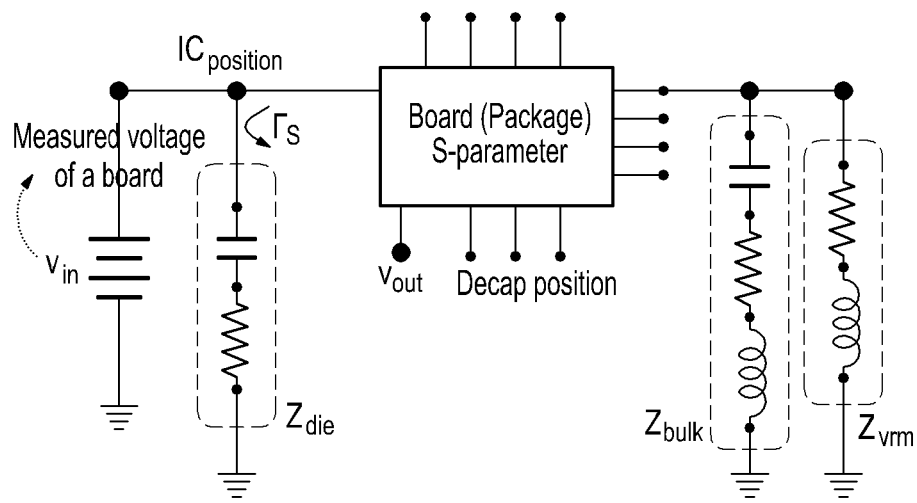
FIG. 8 is a view illustrating a transfer function based on a time domain according to an embodiment of the present disclosure.

FIG. 8 is a view illustrating a transfer function based on a time domain according to an embodiment of the present disclosure.

Referring to FIG. 8, when the measured voltage of the board is used as an input source, a time domain transfer function (TTF) may be expressed by Equation (5) as shown in FIG. 4B.

$$TTF = FFT[v_{out}(t)]/FFT[v_{in}(t)] \quad \text{Equation (5)}$$

Also, the IC voltage $V_{die}$ of operation S407 of FIG. 4 may be calculated by Equation (6) below.

$$v_{die} = IFFT\{FFT[v_{in}(t)]/(STF \text{ or } TTF)\} \quad \text{Equation (6)}$$

However, the above-mentioned transfer functions STF and TTF consider the probe noise which is always included in the measurement. When the probe noise is not removed, the IC voltage $V_{die}$ may be excessively calculated.

FIGS. 9A, 9B, 9C and 9D are graphs illustrating a reason of excessively calculating an IC voltage in a case where a probe noise is not considered according to an embodiment of the present disclosure.

Referring to FIG. 9A, when frequency data for a result of the time domain simulation is considered, it is found that a value of Vout(f) is relatively small in comparison with a value of Vin(f).

Figure 9D:
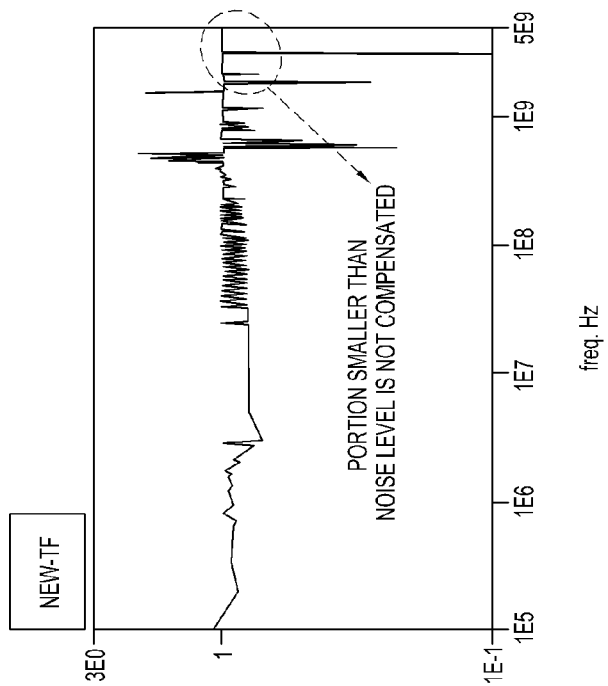
Figure 9C:
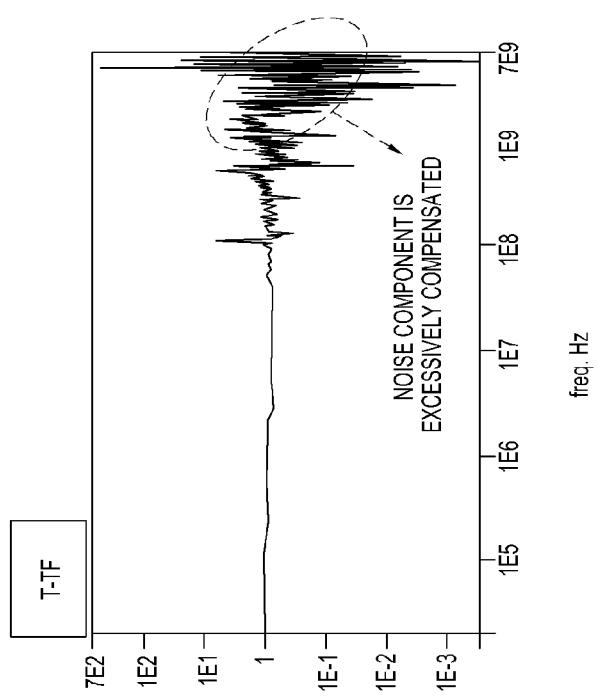

Referring to FIGS. 9B, 9C and 9D, accordingly, a high-frequency component may be excessively compensated when the IC voltage is extracted by using the TTF value. Further, in a certain frequency, a portion exists in which the Vout(f) becomes very large in comparison with the Vin(f) because of a series resonance due to the S-parameter of the ODC/ODR, the board and the package of the IC.

Therefore, in the present disclosure, a new transfer function NEWTF is proposed like Table 1 below in order to remove the probe noise.

TABLE 1

| Condition 1 | Condition 2 | |
|---|---|---|
| Vin(f) > Vout(f) | Vin(f) > PNL | Vout(f)/Vin(f) |
|  | Vin(f) ≤ PNL | 1 |
| Vin(f) ≤ Vout(f) | Vout(f) > PNL | Vout(f)/Vin(f) |
|  | Vout(f) ≤ PNL | 1 |

Herein, the $V_{in}(f)=FET[V_{in}(t)]$, $V_{out}(f)=FET[V_{out}(t)]$, and PNL is a probe noise level.

In the proposed new transfer function NEWTF, if values of the Vin(f) and the Vout(f) are smaller than the probe noise level under each condition, the transfer function is defined as 1, while if the values of the Vin(f) and the Vout(f) are larger than the probe noise level, the TTF is applied.

However, if a frequency range of the IC current to be extracted corresponds to a low frequency and an effect of a series resonance is insignificant, the STF and TTF may be used. The IC voltage may be calculated by using the transfer function (STF, TTF or NEWTF) obtained in such a manner as described above according to Equation (7) below. The below Equation (7) is to calculate an IC voltage according to a new transfer function. Accordingly, the calculation of the IC voltage using the STF or TTF may be performed by substituting the STF or TTF for the NEWTF used as the denominator in Equation (7).

$$v_{die}=IFFT\{FFT[v_{in}(t)]/NEWTF\} \quad \text{Equation (7)}$$

Therefore, the accurate IC current in operation S409 of FIG. 4 is extracted by the time domain simulation as shown in FIGS. 9A, 9B, 9C and 9D.

Figure 10:
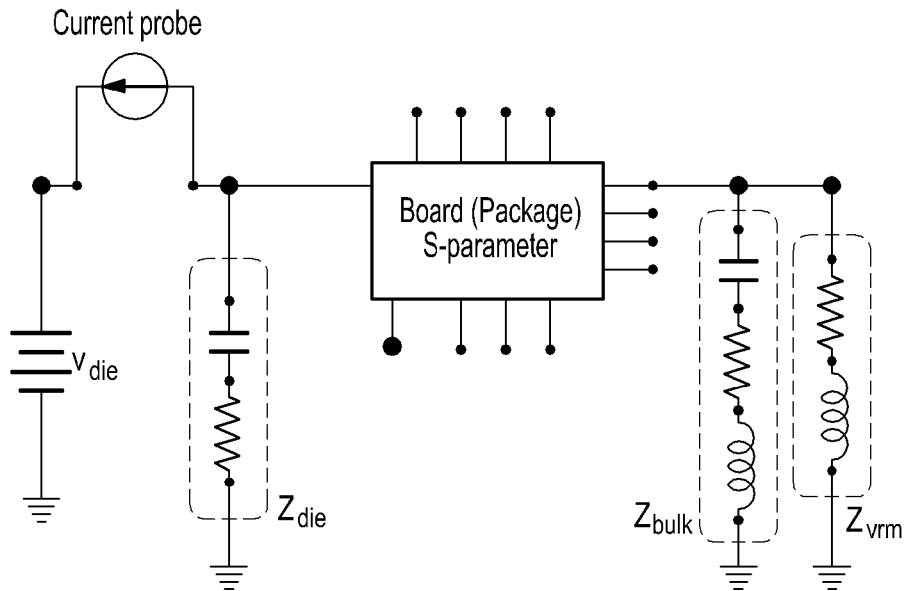
FIG. 10 is a view illustrating a simulation in a time domain for extracting an IC current according to an embodiment of the present disclosure.

FIG. 10 is a view illustrating a simulation in a time domain for extracting the IC current according to an embodiment of the present disclosure.

Figure 11:
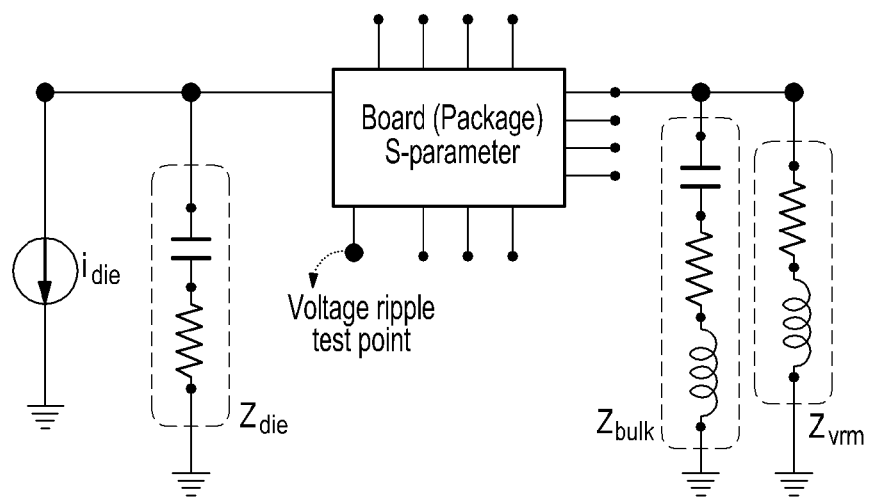
FIG. 11 is a view illustrating a simulation in a time domain for optimizing the de-coupling capacitor according to an embodiment of the present disclosure.

Referring to FIG. 10, the optimization of the de-coupling capacitor may be performed according to the voltage noise level through the simulation as shown in FIG. 11.

FIG. 11 is a view illustrating a simulation in a time domain for optimizing a de-coupling capacitor according to an embodiment of the present disclosure.

Referring to FIG. 11, simulation in a time domain for the optimization of the de-coupling capacitor is illustrated.

Hereinafter, a process of extracting the IC current proposed in an embodiment of the present disclosure will be verified.

Figure 12:
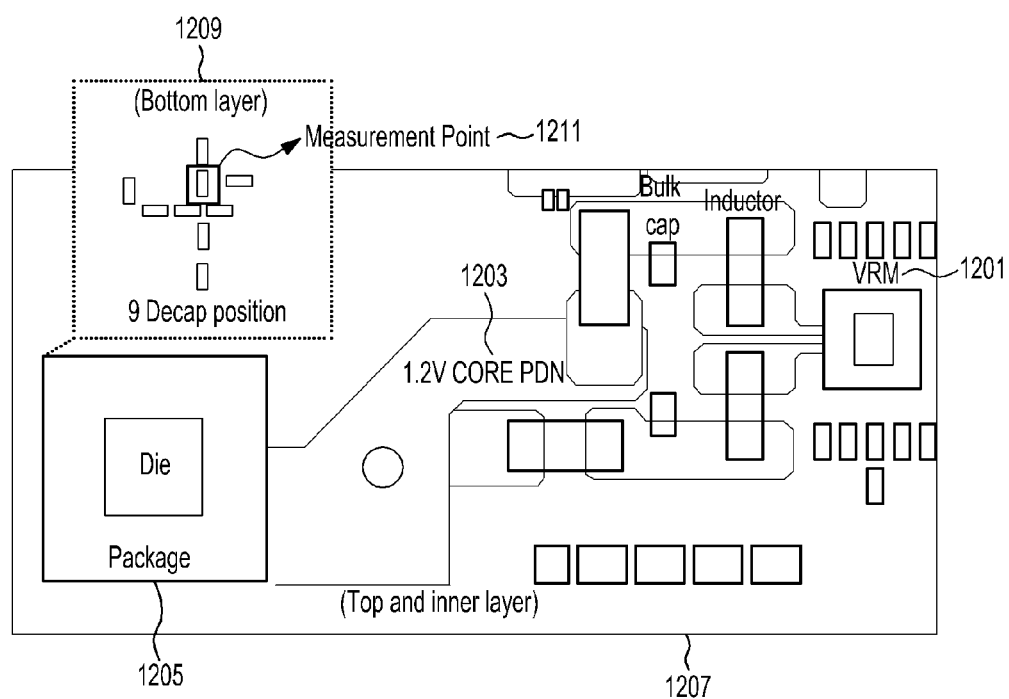
FIG. 12 is a view illustrating a core circuit of 1.2V in which a Voltage Regulation Module (VRM), a PDN, an IC (package and die) and nine de-coupling capacitors are arranged according to an embodiment of the present disclosure.

FIG. 12 is a view illustrating a core circuit of 1.2V in which a VRM, a PDN, an IC (package and die) and nine de-coupling capacitors are arranged according to an embodiment of the present disclosure.

Referring to FIG. 12, in order to verify the process of extracting the IC current proposed in the present disclosure, it is designed that the VRM 1201, PDN 1203 and IC (package and die) 1205 are arranged on top and inner layers and the nine capacitors are arranged on a bottom layer 1209, in the prepared core circuit of 1.2V. One de-coupling capacitor among the nine de-coupling capacitors, which is located nearest an input terminal of the IC, is set as a measurement point 1211 as shown in the drawing.

In the present disclosure, the IC current of the core circuit of 1.2V was extracted and the measured information was compared with simulated current information at a measurement point of the de-coupling capacitor. The detailed result is as follows.

In the present disclosure, after one de-coupling capacitor to be nearest the input terminal of the IC is removed, a PDN impedance including a VRM model and an IC model were measured at a measurement point 1211 through a shunt-thru method by using the network analyzer. The network analyzer may be, for example, Agilent E5061B.

In the present disclosure, since the S-parameter of the PCB and the package is obtained, the manual parts (ODC, ODR, Rvrm and Lvrm) shown in FIG. 5 may be calculated by a curve-fitting method.

Figure 13:
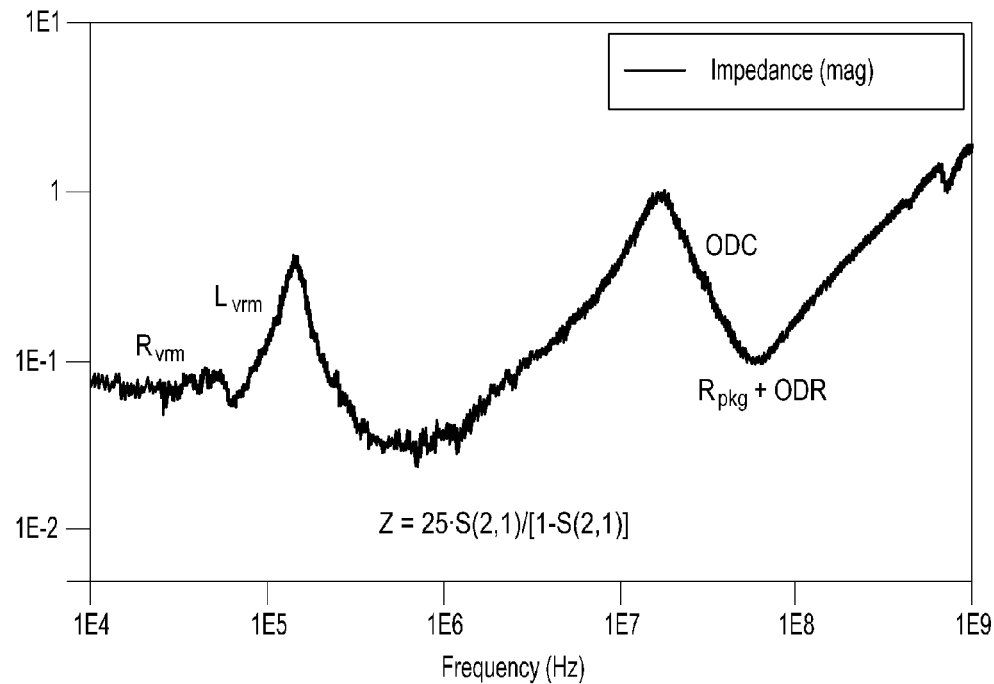
FIG. 13 is a graph illustrating PDN impedance of FIG. 12 according to an embodiment of the present disclosure.

FIG. 13 is a graph illustrating a calculation result of a PDN impedance of FIG. 12 according to an embodiment of the present disclosure.

Referring to FIG. 13, the related manual parts are as follows, the ODC=25 nF, the ODR=80 m0, the Rvrm=52 m0 and the Lvrm=110 nH, and thereby a complete PDN model may be prepared.

Next, the voltage waveform of the board was measured by using a digital oscilloscope (Tektronix DSA70404C) at the identical point under the worst condition. The IC voltage data was determined by Equation (7).

Figure 14:
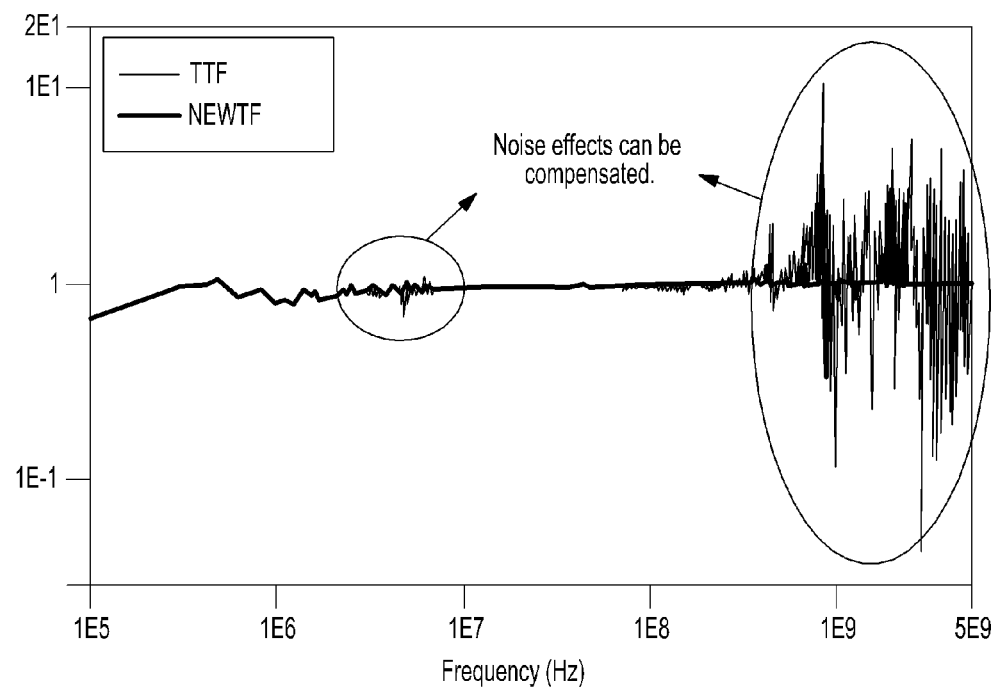
FIG. 14 is a graph illustrating a comparison of a result of a time domain simulation based on a transfer function with a result of a simulation based on a new transfer function proposed in the present disclosure, in a case where a noise level of an oscilloscope probe is 0.05 mV according to an embodiment of the present disclosure.

FIG. 14 is a graph illustrating a comparison of a result of a time domain simulation based on a transfer function (TTF) with a result of a simulation based on a new transfer function (NEW-TF) proposed in the present disclosure, in the case that a noise level of an oscilloscope probe is 0.05 mV according to an embodiment of the present disclosure.

Referring to FIG. 14, it may be known that the probe noise level is remarkably reduced by the new transfer function (NEW-TF) proposed in the present disclosure.

Finally, the IC current is calculated through the time domain simulation shown in FIGS. 9C and 9D. In turn, the time domain waveform of the extracted IC current is shown in FIG. 15.

Figure 15:
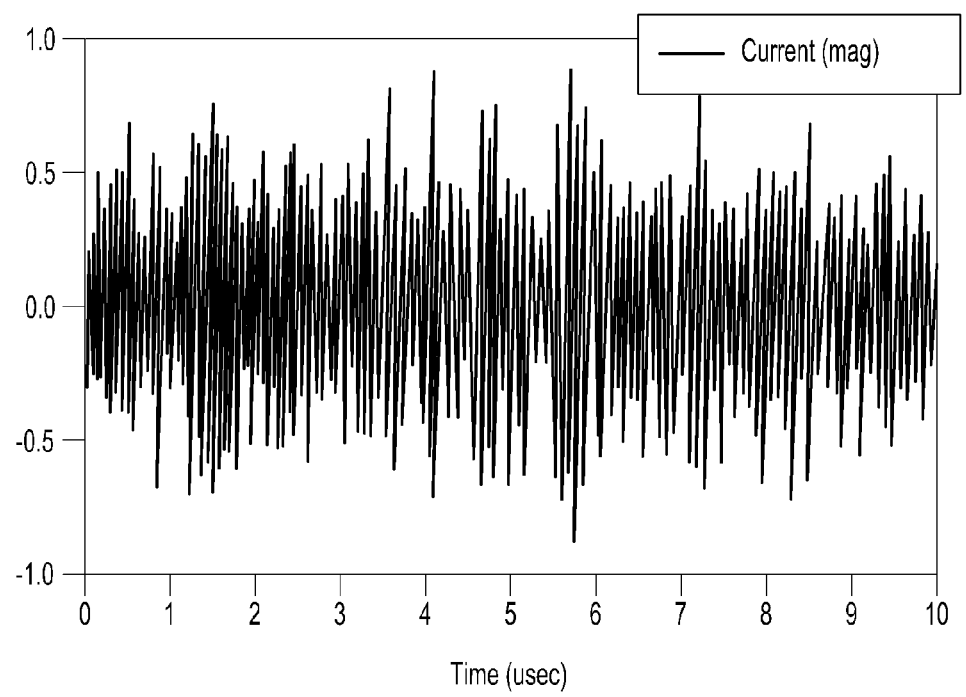
FIG. 15 is a view illustrating waveforms in a time domain of a extracted IC current according to an embodiment of the present disclosure.

FIG. 15 is a view illustrating waveforms in the time domain of an extracted IC current according to an embodiment of the present disclosure.

Referring to FIG. 15, waveforms in the time domain of the extracted IC current according to an embodiment are illustrated.

In the present specification, the simulated voltage data and the measured data are compared by using the extracted IC current as a source of FIG. 10 in the frequency domain.

Figure 16A:
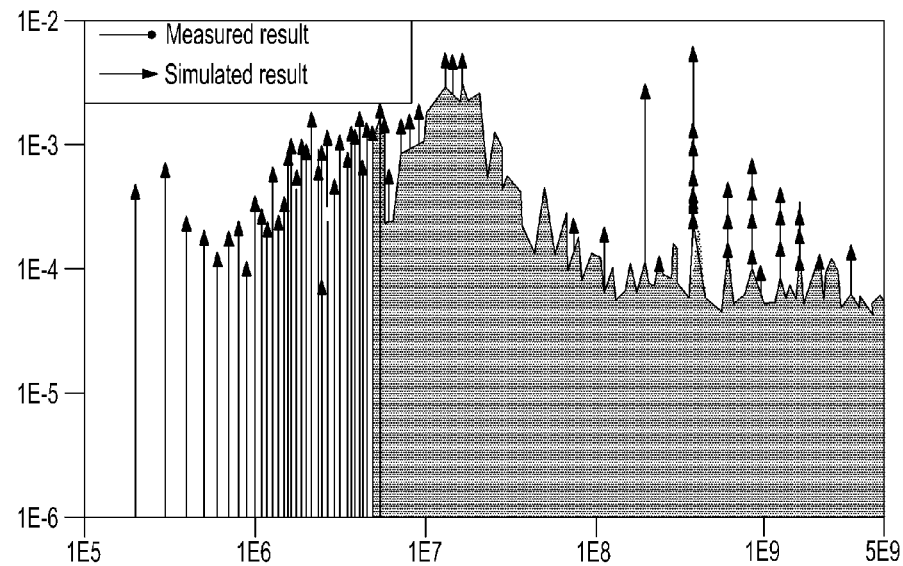
FIG. 16A is a graph illustrating a comparative result when a nine de-coupling capacitors are removed according to an embodiment of the present disclosure.
Figure 16B:
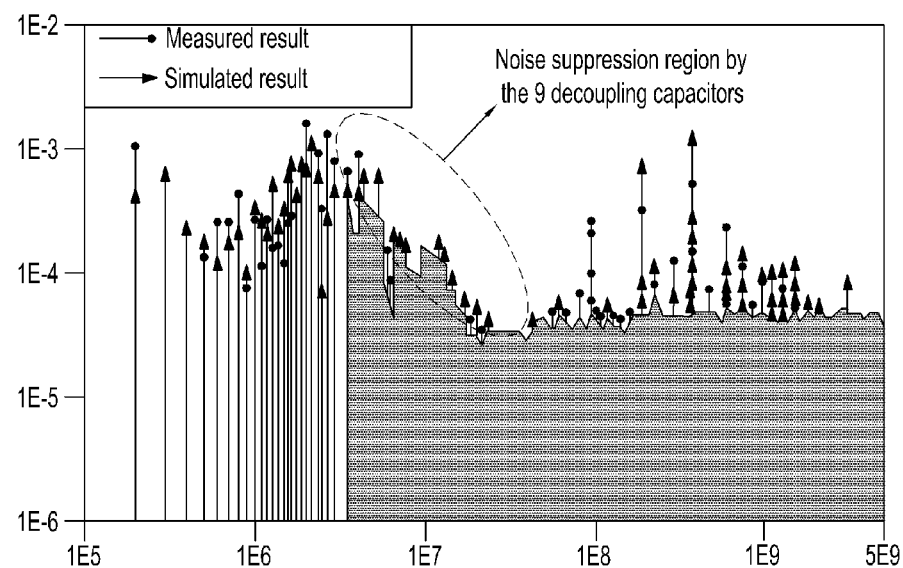
FIG. 16B is a graph illustrating a comparative result when no de-coupling capacitor is removed according to an embodiment of the present disclosure.

FIG. 16A is a graph illustrating a comparative result when a nine de-coupling capacitors are removed according to an embodiment of the present disclosure, and FIG. 16B is a graph illustrating a comparative result when no de-coupling capacitors are removed according to an embodiment of the present disclosure.

Referring to FIG. 16A, in the case that nine de-coupling capacitors are removed, it is identified that a spectrum of the simulated voltage is significantly identical to a measured result.

Referring to FIG. 16B, in the case that nine de-couplings are not removed, an identical noise restrictive region was identified through the nine de-coupling capacitors.

A below Table 2 indicates a comparison of a voltage peak to peak data Vpp according to the number of the decoupling capacitors. A predicted (simulated) Vpp and a measured Vpp are decreased when the number of the de-coupling capacitors increases, and a result preferably corresponds to an error less than 10 mV.

TABLE 2

| Number of 100 nF Decpa | Predicted Vpp (mV) | Measured Vpp (mV) | Predicted Vpp (%) | Measured Vpp (%) | ΔVpp (mV) | ΔVpp (%) |
|---|---|---|---|---|---|---|
| 0 | 165 | 162 | 13.8 | 13.5 | 3 | 0.3 |
| 1 | 79 | 80 | 6.6 | 6.7 | −1 | −0.1 |
| 2 | 60 | 66 | 5.0 | 5.5 | −6 | −0.5 |
| 3 | 52 | 54 | 4.3 | 4.5 | −2 | −0.2 |
| 4 | 48 | 56 | 4.0 | 4.7 | −8 | −0.7 |
| 5 | 44 | 52 | 3.7 | 4.3 | −8 | −0.6 |
| 6 | 41 | 52 | 3.4 | 4.3 | −11 | −0.9 |
| 7 | 39 | 44 | 3.3 | 3.7 | −5 | −0.4 |
| 8 | 37 | 46 | 3.1 | 3.8 | −9 | −0.7 |
| 9 | 35 | 42 | 2.9 | 3.5 | −7 | −0.6 |

In order to verify a correlation in the time domain between the predicted data and the measured data, Table 2 indicates a comparison of magnitude of a voltage ripple with a simulated magnitude instead of the time domain waveform because of a difficulty in measuring data in the identical time.

Figure 17:
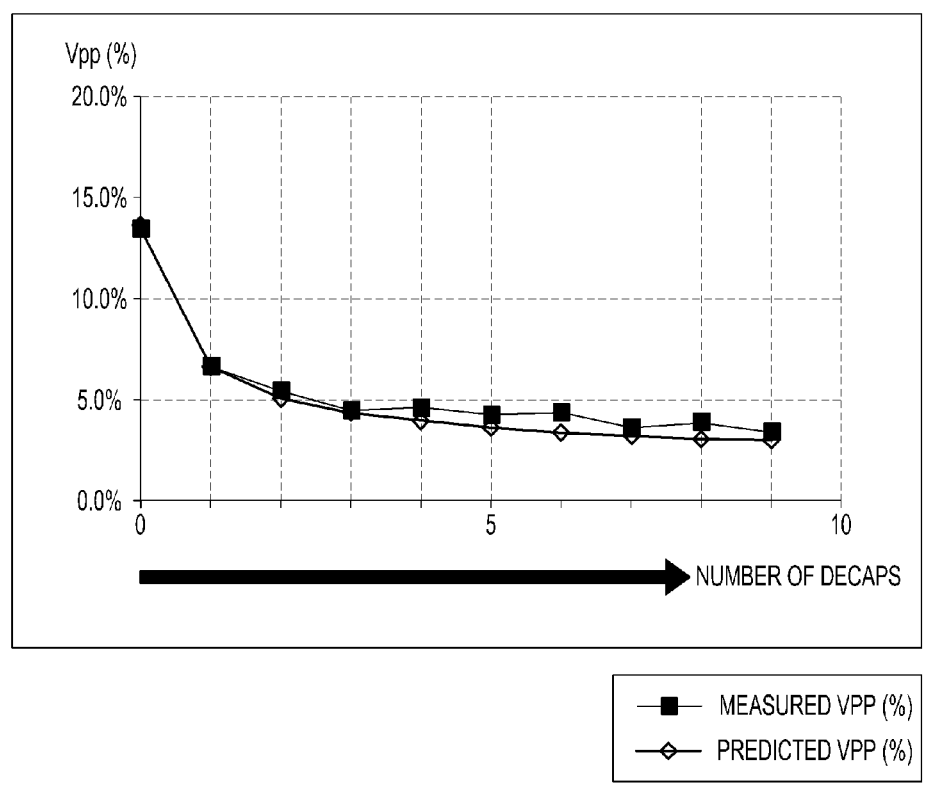
FIG. 17 is a graph illustrating a comparison of a predicted Vpp percentage with a measured Vpp percentage with relation to a number of de-coupling capacitors according to an embodiment of the present disclosure.

FIG. 17 is a graph illustrating a comparison of a predicted Vpp percentage with a measured Vpp percentage with relation to a number of de-coupling capacitors.

Referring to FIG. 17, a difference between the predicted Vpp percentage and the measured Vpp percentage is less than 1%. The result is sufficient to verify the method of extracting the proposed accurate IC current.

Up to now, in the case that the detailed IC data cannot be secured, the method of extracting the accurate IC current using the voltage measured at a certain point on the board, which is proposed in the present disclosure, has been described. In the present disclosure, the voltage waveform measured at a point of the de-coupling capacitor nearest the IC after the capacitor is removed is used as the certain point.

In an embodiment of the present disclosure, further, a new input-to-output transfer function to which the probe noise effect is applied is proposed, and it is known that the accurate IC voltage may be obtained by the proposed new transfer function.

In an embodiment of the present disclosure, furthermore, the accurate IC current is finally extracted by using the IC voltage waveform and the PDN information. The proposed method is verified by comparing the simulated voltage information using the extracted IC current as the source with the measured voltage information.

In an embodiment of the present disclosure, moreover, it is verified through Table 2 and FIG. 17 that the identification of two results in the frequency domain is excellent, and it is identified that the difference between the predicted Vpp and the measured Vpp is less than 10 mV. Therefore, the IC extracting method proposed by the present disclosure may be usefully used in the design and optimization of the PDN. For example, the voltage of the corresponding board is predicted by using the extracted IC current so that the design of the PDN on the corresponding board may be optimized based on the voltage ripple. Further, the voltage of another board using an identical IC is predicted by using the extracted IC current so that the design of the PDN on the corresponding board may be optimized based on the voltage ripple.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of extracting an integrated circuit (IC) current using an IC current extracting device, the IC current extracting device electrically connected to a board provided with an IC, the method comprising:
    determining a position of a de-coupling capacitor nearest to an input terminal of the IC as a measurement point;
    measuring a voltage at the measurement point after de-coupling capacitors are removed, wherein the de-coupling capacitor nearest to the input terminal of the IC is one of the removed de-coupling capacitors;
    determining the measured voltage as an input voltage;
    generating an output voltage based on an on-die capacitance (ODC) and an on-die resistance (ODR) of the IC, and S-parameter information of the board;
    generating a transfer function value based on the input voltage and the output voltage, wherein the transfer function value is generated by a transfer function defined based on a noise level included in the measured voltage;
    performing a reverse fast Fourier transform function for the generated transfer function value so as to extract the IC voltage;
    extracting an IC current by executing a computer simulation of a time domain based on the extracted IC voltage;
    extracting a voltage of the board by using the extracted IC current; and
    determining a power distribution network of the board based on the extracted IC current and the extracted voltage.

2. The method as claimed in claim 1, wherein the transfer function value is generated based on a ratio of the input voltage to the output voltage when the input voltage and the output voltage are greater than the noise level.

3. The method as claimed in claim 1, wherein the ODC and the ODR of the IC are measured by a two-port shunt thru method.

4. The method as claimed in claim 1, wherein the transfer function value is any one of a first transfer function value, a second transfer function value and third transfer function value, the first transfer function value is defined as a transfer function value based on the S-parameter information using a reflection coefficient between a source and a load, the second transfer function value is defined as a transfer function value based on the time domain, and the third transfer function value is defined as any one of the second transfer function value and 1 according to a preset condition.

5. The method as claimed in claim 4,
    wherein the preset condition includes:
        a first condition in which the input voltage is compared with the output voltage; and
        a second condition in which a preset probe noise level is compared with the input voltage or the output voltage, and
    wherein the preset probe noise level is a noise generated in a process of measuring the measured voltage in a node using a probe.

6. The method as claimed in claim 5, wherein the third transfer function value is defined as the second transfer function value when the input voltage is greater than the output voltage and the preset probe noise level.

7. The method as claimed in claim 5, wherein the third transfer function value is defined as 1 when the input voltage is greater than the output voltage, and is equal to or smaller than the preset probe noise level.

8. The method as claimed in claim 5, wherein the third transfer function value is defined as the second transfer function value when the input voltage is equal to or smaller than the output voltage, and is greater than the preset probe noise level.

9. The method as claimed in claim 5, wherein the third transfer function value is defined as 1 when the input voltage is equal to or smaller than the output voltage and the preset probe noise level.

10. The method as claimed in claim 1, further comprising generating a database using the extracted IC current.

11. A device for extracting an integrated circuit (IC) current, the device provided on a board, using at least one processor, the device comprising:
the at least one processor configured to:
determine a position of a de-coupling capacitor nearest to an input terminal of the IC as a measurement point,
measure a voltage at the measurement point after de-coupling capacitors are removed, wherein the de-coupling capacitor nearest to the input terminal of the IC is one of the removed de-coupling capacitors,
determine the measured voltage as an input voltage,
generate an output voltage based on an on-die capacitance (ODC) and an on-die resistance (ODR) of the IC, and S-parameter information of the board,
generate a transfer function value based on the input voltage and the output voltage, wherein the transfer function value is generated by a transfer function defined according to a noise level included in the measured voltage,
perform a reverse fast Fourier transform function for the generated transfer function value so as to extract the IC voltage,
extract an IC current by executing a computer simulation of a time domain based on the extracted IC voltage,
extract a voltage of the board by using the extracted IC current, and
determine a power distribution network of the board based on the extracted IC current and the extracted voltage.

12. The device as claimed in claim 11, wherein the transfer function value is generated based on a ratio of the input voltage to the output voltage when the input voltage and the output voltage being greater than the noise level.

13. The device as claimed in claim 11, wherein the ODC and the ODR of the IC are measured by a two-port shunt thru method.

14. The device as claimed in claim 11, wherein the transfer function value is any one of a first transfer function value, a second transfer function value and a third transfer function value, the first transfer function value is defined as a transfer function value based on the S-parameter information using a reflection coefficient between a source and a load, the second transfer function value is defined as a transfer function value based on the time domain, and the third transfer function value is defined as any one of the second transfer function value and 1 according to a preset condition.

15. The device as claimed in claim 14,
wherein the preset condition includes:
a first condition in which the input voltage is compared with the output voltage, and
a second condition in which a preset probe noise level is compared with the input voltage or the output voltage, and
wherein the preset probe noise level is a noise generated in a process of measuring the measured voltage in the node using a probe.

16. The device as claimed in claim 15, wherein the third transfer function value is defined as the second transfer function value when the input voltage is greater than the output voltage and the preset probe noise level.

17. The device as claimed in claim 15, wherein the third transfer function value is defined as 1 when the input voltage is greater than the output voltage, and is equal to or smaller than the preset probe noise level.

18. The device as claimed in claim 15, wherein the third transfer function value is defined as the second transfer function value when the input voltage is equal to or smaller than the output voltage, and is greater than the preset probe noise level.

19. The device as claimed in claim 15, wherein the third transfer function value is defined as 1 when the input voltage is equal to or smaller than the output voltage and the preset probe noise level.

20. The device as claimed in claim 11, wherein the extracted IC current is used to generate a database.

* * * * *